United States Patent
Peters et al.

(10) Patent No.: US 7,295,589 B2
(45) Date of Patent: Nov. 13, 2007

(54) FREQUENCY MODULATED VERTICAL CAVITY LASER

(75) Inventors: Frank H. Peters, San Jose, CA (US); Ken A. Nishimura, Fremeont, CA (US); Jonathan Simon, Castro Valley, CA (US); Kirk S. Giboney, Santa Rosa, CA (US)

(73) Assignee: Avago Technologies Fiber (Singapore) Pte Ltd, Singapore (SG)

( * ) Notice: Subject to any disclaimer, the term of this patent is extended or adjusted under 35 U.S.C. 154(b) by 511 days.

(21) Appl. No.: 10/368,177

(22) Filed: Feb. 15, 2003

(65) Prior Publication Data

US 2004/0160997 A1 Aug. 19, 2004

(51) Int. Cl.
*H01S 5/00* (2006.01)

(52) U.S. Cl. ............... 372/50.1; 372/43.01; 372/46.01; 372/28; 372/99; 372/96

(58) Field of Classification Search ............. 372/45–50, 372/28, 99, 96, 43.01, 50.1, 50.11, 46.01
See application file for complete search history.

(56) References Cited

U.S. PATENT DOCUMENTS

| | | | |
|---|---|---|---|
| 5,155,736 A | * | 10/1992 | Ono et al. .................... 372/20 |
| 6,023,485 A | * | 2/2000 | Claisse et al. ................ 372/50 |
| 6,028,693 A | * | 2/2000 | Fork et al. ................... 359/248 |
| 6,195,485 B1 | * | 2/2001 | Coldren et al. ............... 385/49 |
| 6,347,104 B1 | * | 2/2002 | Dijaili et al. ............ 372/38.01 |
| 6,549,556 B1 | * | 4/2003 | Hwang et al. ................ 372/96 |
| 6,600,765 B2 | * | 7/2003 | Evans et al. ................. 372/50.1 |
| 6,661,825 B2 | * | 12/2003 | Evans et al. .................. 372/50 |
| 6,771,589 B2 | * | 8/2004 | Ueyanagi et al. ........... 369/300 |
| 6,959,027 B1 | * | 10/2005 | Guilfoyle et al. ............. 372/18 |
| 2002/0031155 A1 | | 3/2002 | Tayebati et al. |
| 2006/0088066 A1 | * | 4/2006 | He .............................. 372/10 |

OTHER PUBLICATIONS

Chang-Hasnain, Connie, "Tunable VCSELs: Enabling Wavelength-on-Demand in Metro Networks" Compound Semiconductor, Jun. 2001, pp. 1-3.
Chang-Hasnain, Connie, "Tunable VCSEL", IEEE Journal of Selected Topics in Quantum Electronics, vol. 6, No. 6, Nov.-Dec. 2000, pp. 978-987.

* cited by examiner

*Primary Examiner*—Minsun Oh Harvey
*Assistant Examiner*—Delma R. Flores Ruiz

(57) ABSTRACT

A frequency modulated (FM) vertical cavity surface emitting laser (VCSEL). The frequency modulated VCSEL includes a mirror region that has an active region. The frequency modulated VCSEL also includes a phase adjustment region for use in altering the characteristics of the VCSEL. For example, by changing the index of refraction in the phase adjustment region, the wavelength of the VCSEL can be changed, resulting in frequency modulation.

11 Claims, 2 Drawing Sheets

FREQUENCY MODULATED VERTICAL CAVITY LASER

FIELD OF THE INVENTION

The present invention relates generally to semiconductor-based lasers, and more particularly, to a frequency modulated (FM) vertical cavity surface-emitting laser (VCSEL).

BACKGROUND OF THE INVENTION

Optical data communication systems provide an important way for transferring large amounts of data at high speeds. An important component in these optical data communication systems is an optical transceiver (TRANSmitter+reCEIVER). On the transmission side, the optical transmitter portion functions to translate data in the form of electrical signals (e.g., digital information in the form of 1s and 0s) into optical signals that are suitable for transmission via a transmission medium (e.g., fiber optic cable). On the reception side, the optical receiver portion converts the received optical signals back into data in the form of electrical signals. An important component in the optical transceiver design is the transmitter for transmitting optical data. Typically, the transmitter is implemented with a light emitting diode (LED) for megabit applications and a semiconductor laser diode for gigabit applications.

Semiconductor laser diodes were originally fabricated in a manner that provides an optical cavity formed parallel to the surface of the semiconductor wafer. In this structure, light is emitted from the edge of the wafer. Unfortunately, this structure does not lend itself to low cost "mass" manufacturing or to the cost-effective fabrication of two-dimensional arrays of laser diodes.

A new class of laser diodes is fabricated such that the optical cavity is formed perpendicular to the surface of the semiconductor wafer, and the light is emitted perpendicular to the surface. These laser diodes are commonly referred to as Vertical Cavity Surface-Emitting Lasers (VCSELs). A typical VCSEL consists of an active region, which emits light and surrounding mirrors constructed from alternating layers of materials having different indices of refraction. These lasers are better suited for the fabrication of arrays and are widely utilized in optical data communication systems.

Vertical Cavity Surface Emitting Lasers (VCSELs) are considered to be important components in optical communication systems. VCSELs can easily be made into one and two-dimensional arrays since they emit light perpendicular to the plane of the semiconductor wafer.

High Speed Design Considerations

As the demand for bandwidth in optical communication systems ever increases, new design considerations and mechanisms are required to achieve these types of data transmission speeds. Currently, there are two main approaches to increase bandwidth. One approach utilizes directly modulated lasers. However, this first approach is generally limited to data rates of about 10 Gb/s.

A second approach utilizes external modulators. This second approach can generally achieve data rates of up to about 40 Gb/s, which is greater than the first approach. However, the use of external modulators adds additional complexity to the transmitter design and is typically expensive to implement. Furthermore, many external modulators require high voltages for modulation, thereby further increasing the cost and complexity of the transmitter design.

Unfortunately, the prior art approaches do not provide any mechanism to increase the data rate of current VCSELs without the use of external modulators. Consequently, it is desirable for there to be a VCSEL design that extends the current data rates beyond current limitations without the use of external modulators.

Based on the foregoing, there remains a need for a vertical cavity surface emitting laser (VCSEL) that overcomes the disadvantages set forth previously.

SUMMARY OF THE INVENTION

In accordance with the invention, a frequency modulated (FM) vertical cavity surface emitting laser (VCSEL) is provided. The frequency modulated VCSEL includes a mirror region that has an active region. The frequency modulated VCSEL also includes a phase adjustment region for use in altering the characteristics of the VCSEL. For example, by changing the index of refraction in the phase adjustment region, the wavelength of the VCSEL can be changed, resulting in frequency modulation.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

In accordance with the invention, a frequency modulated (FM) vertical cavity surface emitting laser (VCSEL) is described. In the following description, for the purposes of explanation, numerous specific details are set forth in order to provide a thorough understanding of the invention. It will be apparent, however, to one skilled in the art that the invention may be practiced without these specific details. In other instances, well-known structures and devices are shown in block diagram form in order to avoid unnecessarily obscuring the invention.

It is noted that the semiconductor laser structures, in which the novel aspects of the invention can be implemented, can be an n-up structure or a p-up structure on an n, p or semi-insulating substrate. To manufacture a FM VCSEL according to the invention with a phase adjust region, there may be two junctions: 1) one junction for the laser and 2) another junction for the phase adjust region. Consequently, the device may have an n-p-n or a p-n-p structure. Furthermore, an n, p or semi-insulating substrate can be utilized.

When a backside contact is employed, the n-p-n device can be made on an n-substrate and the p-n-p device can be made on a p-substrate. With top side contacts, the n-p-n and p-n-p devices can be made on any of the three substrates. For example, the p-n-p device can be made on an n-substrate, where the actual epi structure is p-n-p-n. However, when only the top p-n-p structure is used, the last junction is not important. Moreover, for a fast device, a structure made on the semi-insulating substrate has a substantial advantage since a low parasitic capacitance is easier to achieve. Consequently, in practice, for a device with speeds of 10 Gb/s or greater, only a device on the semi-insulating substrate is important.

In a vertical cavity surface emitting laser (VCSEL), the frequency of operation is determined by the Fabry-Perot wavelength of the laser cavity. In prior art single-mode VCSELs, the laser cavity is designed so that there is only one Fabry-Perot wavelength that sees gain from the laser's active region. This wavelength is commonly referred to as the "wavelength of emission" or "lasing wavelength." In prior art VCSELs, an active region is disposed between two Distributed Bragg Reflectors (DBRs). The DBRs and the active region define the Fabry-Perot or lasing wavelength.

Figure 1:
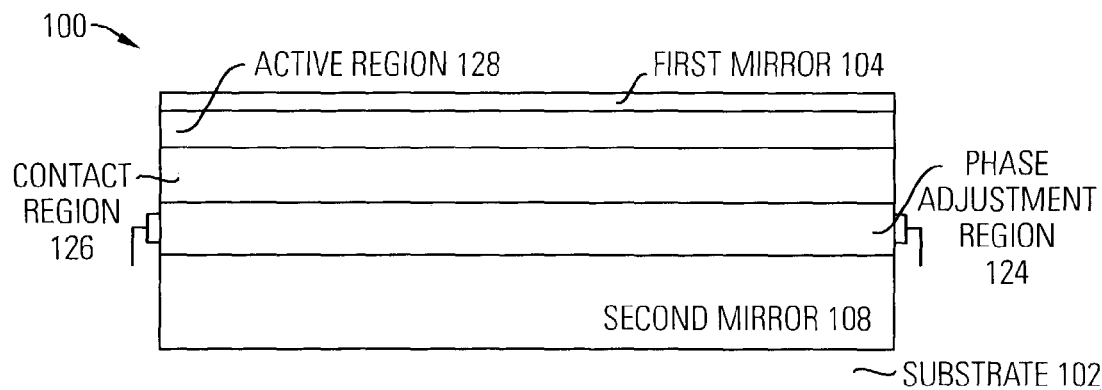
FIG. 1 illustrates a frequency modulated (FM) vertical cavity surface emitting laser (VCSEL) with a phase adjustment region and an active region in a first DBR according to one embodiment of the invention.

FIG. 1 illustrates a frequency modulated (FM) vertical cavity surface emitting laser (VCSEL) 100 with a phase adjustment region 124 and an active region 128 in a first DBR 104 according to one embodiment of the invention. In this embodiment, the VCSEL 100 in accordance with the invention includes a first mirror region 104, a second mirror region 108, a phase adjustment region (PAR) 124, a contact region 126, and an active region 128 disposed in the first mirror 104. The PAR 124 is disposed between the first mirror region 104 and the second mirror region 108 in the region where the active region is typically found in prior art VCSELs. For example, the PAR 124 may be sandwiched between the first mirror region 104 and the second mirror region 108.

The contact region 126 provides a contact between the PAR 124 and the active region 128. The contact region 126 may also be disposed, but does not necessarily need to be, part of the first mirror 104. In this case, the active region 128 is disposed within the first mirror 104.

The first mirror region 104 and the second mirror region 108 are typically constructed from alternating layers with different indices of refraction. The thickness of each layer is typically chosen to be one quarter of the wavelength of the light within each layer. The stacks form a structure known as a distributed Bragg reflector (DBR) mirror structure. To obtain the desired reflectivity, multiple pairs of layers are required.

A laser or VCSEL is a p-i-n (or n-i-p) diode. A phase adjustment region may also be a p-i-n or n-i-p diode. In a preferred embodiment the PAR 124 is a p-i-n or n-i-p diode. When the device includes a VCSEL and a phase adjustment region, the device is a p-i-n-i-p or n-i-p-i-n device, where one junction makes up the laser and the other junction makes up the phase adjustment region.

In the case that the PAR 124 is not made from a diode, the PAR 124 still needs to have some sort of contact. Accordingly, the mirror that exists on the other side of the PAR 124 from the active region only needs to be doped according to what is expected by the PAR 124. The laser portion is electrically defined by the lasers up to, but not including the PAR 124.

The PAR 124 includes an optical thickness that may be determined or calculated by multiplying the physical thickness with the index of refraction of the PAR 124. The VCSEL in accordance with the invention takes advantage of the fact that the optical thickness of the PAR 124, disposed between the DBRs 104, 108, controls the Fabry-Perot wavelength. By disposing the phase adjustment region 124 between the DBRs 104, 108, the wavelength of the VCSEL 100 may be adjusted. It is noted that the optical thickness of the PAR 124 (i.e., the physical thickness multiplied by index of refraction) controls the lasing wavelength and not the physical thickness of the PAR. One aspect of the invention is to change the optical thickness of the PAR 124 by altering the index of refraction of the PAR 124.

The active region 128 may be viewed as a light generation layer which generates light due to stimulated emission via the recombination of electrons and holes injected by forward biasing the p-i-n diode. The active region 128 (also referred to herein as a light generation region) is typically constructed from one or more quantum wells of InGaAs, GaAs, AlGaAs, InGaAsN, GaAsSb, also (Al) GaInP, GaInAsP or InAlGaAs. The light generation region 128 may be separated from other portions of the mirror region 104 by spacers (not shown). The choice of material for the active region 128 depends on the desired wavelength of the light emitted by the VCSEL or other desired VCSEL properties. In addition, devices based on bulk active regions are known to those of ordinary skill in the art.

The VCSEL 100 has a layered structure in which the light is emitted in a vertical direction that is perpendicular to the planes of the layers. In a first embodiment, the VCSEL 100 includes a semiconductor substrate 102, a plurality of epitaxially-grown compound semiconductor layers forming a bottom mirror stack 108 above the substrate 102, a top mirror stack 104 above the bottom mirror stack 108, a contact region 126, and a light generation region 128 (also referred to herein as active region) between the mirror stacks 104, 108. It is noted that the light generation region 128 can be disposed in either of the mirror stacks 104 and 108 as shown in FIGS. 1 and 2, or distributed in both of the mirror stacks 104 and 108 as described in greater detail hereinafter with reference to FIG. 3.

The various layers are constructed by epitaxial growth or other deposition methods. Since the construction of these layers is well known to those skilled in the laser arts, it will not be described in detail here.

The laser 100 is operated at a constant bias, and the phase adjustment region or layer 124 is modulated at high frequency to generate data. The phase is adjusted by altering the index of refraction in the phase adjustment region 124. As the index of refraction changes, the optical path length in the phase adjustment region 124 also changes, thereby resulting in a change in the resonant frequency of the cavity (also referred to as the lasing wavelength). The index of refraction may be altered or changed in different ways as described in greater detail hereinafter.

Figure 2:
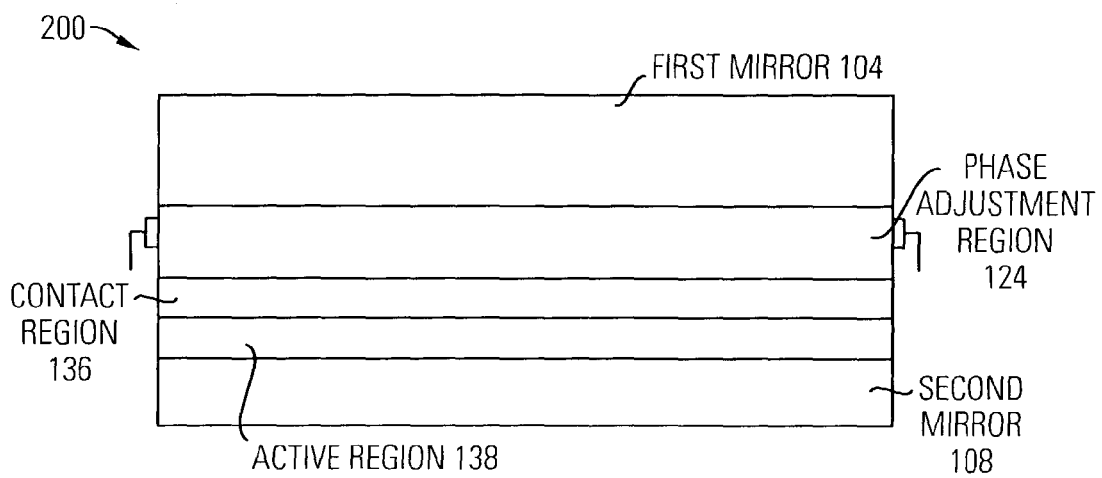
FIG. 2 illustrates a frequency modulated (FM) vertical cavity surface emitting laser (VCSEL) with a phase adjustment region and an active region in a second DBR according to another embodiment of the invention.

FIG. 2 illustrates a frequency modulated (FM) vertical cavity surface emitting laser (VCSEL) 200 with a phase adjustment region 124 and an active region 138 in a second DBR 108 according to another embodiment of the invention.

In this embodiment, the VCSEL 200 in accordance with the invention includes a first mirror 104, a second mirror 108, a phase adjustment region (PAR) 124, and an active region 138 disposed in the second mirror 108. The PAR 124 may be disposed between the first mirror 104 and the second mirror 108 in the region where the active region is typically found in prior art VCSELs. For example, the PAR 124 may be sandwiched between the first mirror 104 and the second mirror 108. The contact region 136 provides a contact between the PAR 124 and the active region 138. The contact region 136 may also be disposed, but does not necessarily need to be, part of the second mirror 108.

Figure 3:
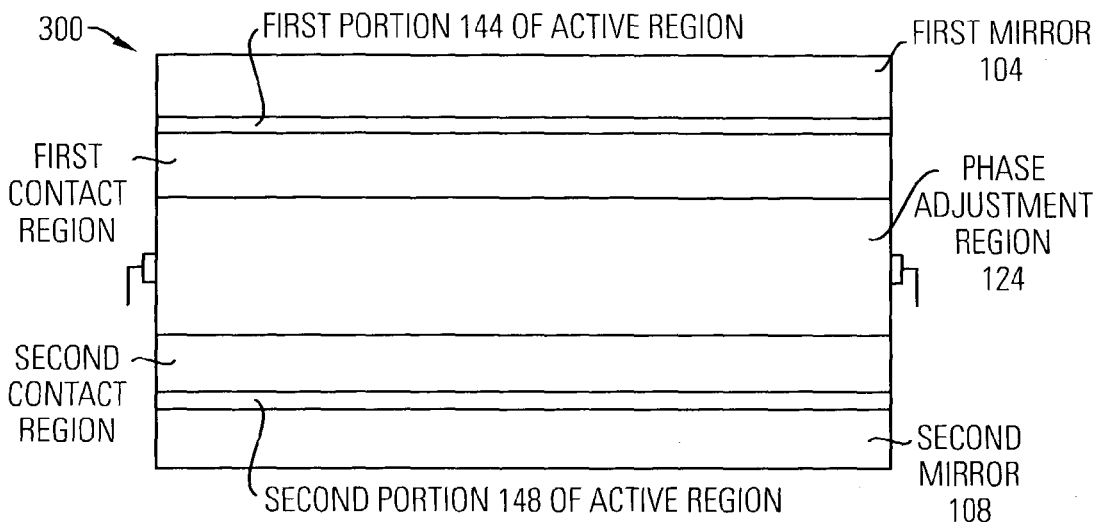
FIG. 3 illustrates a frequency modulated (FM) vertical cavity surface emitting laser (VCSEL) with a phase adjustment region and an active region in both a first DBR and a second DBR according to yet another embodiment of the invention.

FIG. 3 illustrates a frequency modulated (FM) vertical cavity surface emitting laser (VCSEL) 300 with a phase adjustment region 124 and an active region in both a first DBR 104 and a second DBR 108 according to yet another embodiment of the invention.

In this embodiment, the VCSEL 300 includes a first mirror 104, a second mirror 108, a phase adjustment region (PAR) 124, and an active region that is distributed in both the first mirror 104 and the second mirror 108. For example, a first portion 144 of the active region may be disposed in the first mirror 104 and a second portion 148 of the active region may be disposed in the second mirror 108.

Figure 4:
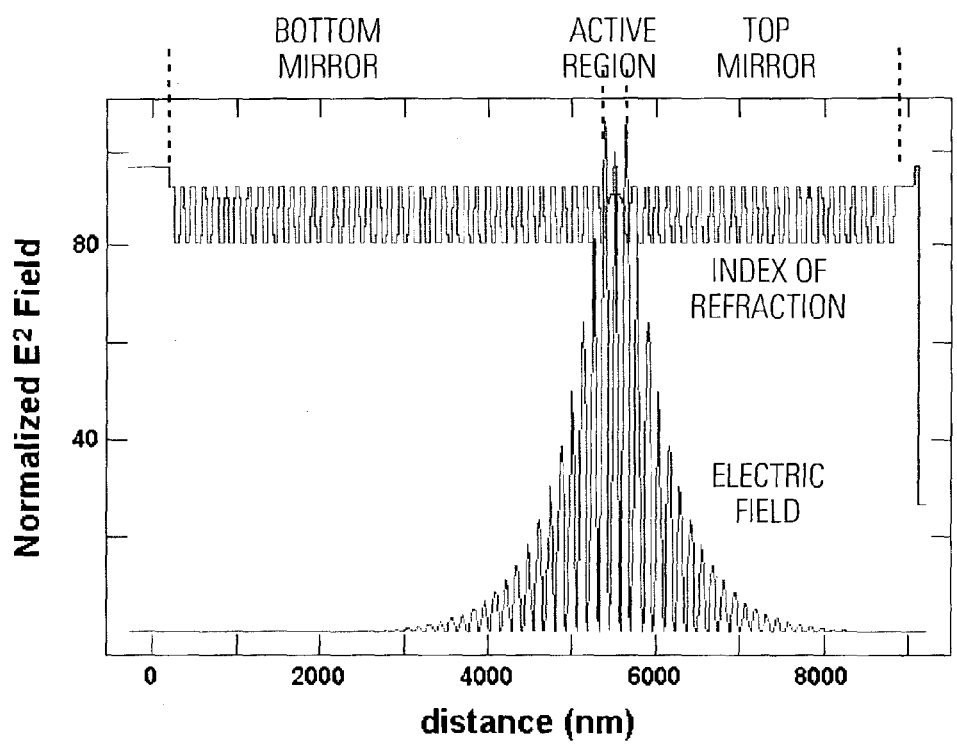
FIG. 4 is a graph illustrating an index of refraction profile and electric field distribution for a prior art VCSEL.

FIG. 4 is a graph illustrating an index of refraction profile and electric field distribution for a prior art VCSEL. The device has a threshold gain of 936 $cm^{-1}$. The threshold gain and electric field profile is derived from theoretical calculation.

Referring to FIG. 4, the quantum wells are located in the active region between the two DBR mirrors of the device. The electric field profile is near its peak at the quantum wells, and falls off rapidly on either side. This is a standard VCSEL design. The higher the electric field profile; the larger the effect of internal gain or loss will be. Consequently, it is preferable to have the gain region where the field is high.

Figure 5:
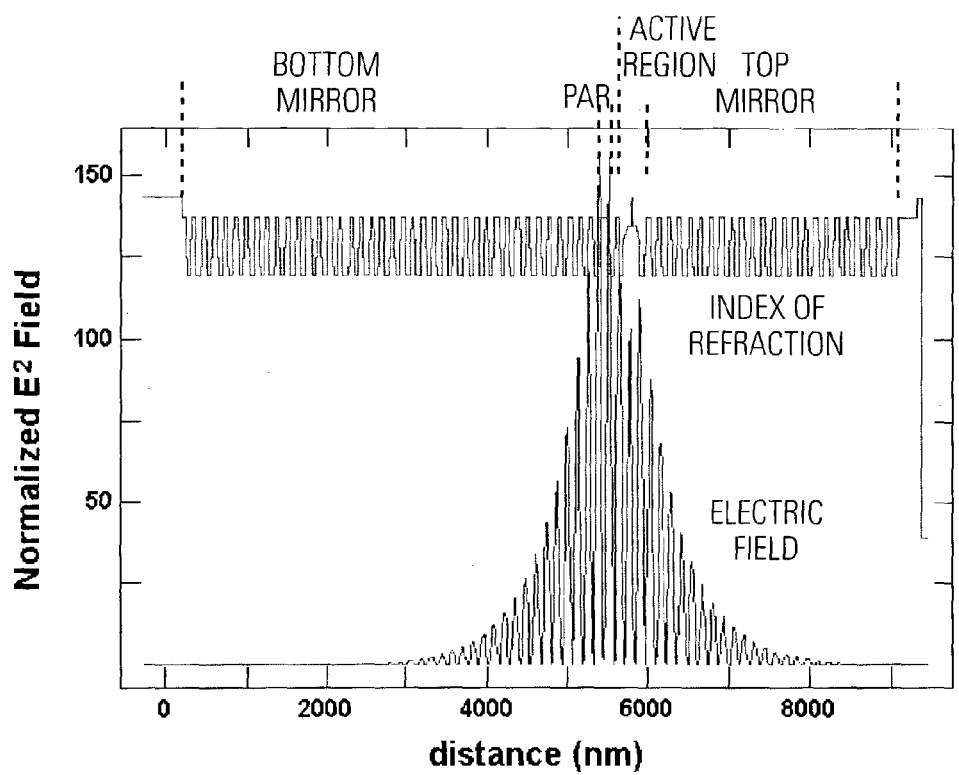
FIG. 5 is a graph illustrating an index of refraction profile and electric field distribution for a VCSEL according to one embodiment of the invention.

FIG. 5 is a graph illustrating an index of refraction profile and electric field distribution for a VCSEL according to one embodiment of the invention. Specifically, FIG. 5 is a graph illustrating an index of refraction profile and electric field distribution for a VCSEL according to the invention when the active region is moved into the top mirror. In this case, the active region is within the outer mirror. This requires an increase in the threshold gain to 1460 $cm^{-1}$.

Referring to FIG. 5, the quantum wells are no longer near the peak of the electric field profile, and the regions near and at the peak do not provide gain (which means they provide some loss). Consequently, the device has a higher threshold current since threshold gain is an indication of how much gain is required to overcome the loss in the laser cavity. In this structure the loss is greater than in the structure of FIG. 4. The further the quantum wells are from the peak of the electric field profile; the higher the required threshold gain will be. As the active region is moved further into the mirror, the threshold gain required continues to increase.

For a directly modulated VCSEL, this increase in threshold gain is undesirable because it would result in a device with a much larger threshold current, which would then be much slower. For a frequency modulated VCSEL according to the invention, as long as the device lases, it is fine.

It is noted that the device of FIG. 5 has a larger threshold gain than the device of FIG. 4. In regard to performance, for modulated devices, the pump has little effect on the frequency modulation performance. For example, with prior art lithium niobate modulators, the performance of this type of modulator does not depend on the source of the light, provided that the light is of the correct wavelength, and perhaps linewidth. Similarly, for the VCSEL according to the invention, even when the laser portion has a high threshold current, performance of the VCSEL is not adversely affected, provided that the device still lases at the correct wavelength (which is controlled by the cavity design) and perhaps linewidth.

The laser portion is lasing at DC (i.e., the laser portion is not modulated), which means that it will be operated at constant current. Consequently, the device has a constant internal gain and a constant internal carrier density. When the modulator portion (PAR) is adjusted, the optical path length of the cavity changes, which results in essentially no change in the required gain of the laser portion. No change in the required gain of the laser portion results because the gain bandwidth is much wider than the amount of shift possible due to the PAR region.

The frequency modulation performance of the device is controlled by the PAR region according to the invention. Depending on the method used to shift or alter the index of refraction (optical path length), there may be some speed limitations. One limitation on speed stems from the capacitance of the PAR region and contacts.

For example, the threshold current can be increased from 1 mA to 10 mA without any problem since the VCSEL portion is operated DC. Only the PAR section is adjusted to force a change in the lasing frequency.

In contrast to prior art tunable VCSELs, where the cavity size of the device is altered, the FM VCSEL according to the invention employs much smaller shifts or changes in frequency to modulate the VCSEL.

It is noted that since information or data is being modulated with very small changes in frequency, it is desirable for the receiver to be configured and designed to decode or recover the information and distinguish the information from ambient noise.

Varying the Index of Refraction

It is noted that the index of refraction can be altered in many different ways. Some of these ways include altering the index of refraction in an electrooptical manner, altering the index of refraction in an magneto-optical manner, altering the index of refraction through the addition of free carriers (plasma optical effect), altering the index of refraction in other manners known to those of ordinary skill in the art, or a combination thereof.

For example, a diode structure may be built in the PAR 124 to allow for an electric field to be applied through a separate set of electrodes across the PAR 124, thereby resulting in a different carrier density.

Similarly, the PAR 124 may be made from an electro-optic material (e.g., InP or GaAs and related materials, lithium niobate), whose index of refraction changes in response to a varying electric field. The PAR 124 can also be made from a liquid crystal material, whose index of refraction also changes as a function of the applied electric field. The liquid crystal material can then be wafer bonded to the first and second mirrors 104, 108. Similarly, the PAR 124 may be made from material whose index of refraction changes in response to a varying magnetic field.

By using an FMVCSEL in accordance with the invention, a transmitted signal is optical frequency modulated, i.e. the light (carrier) frequency is modulated similarly to an FM radio signal, in which a radio frequency signal is frequency modulated. The optical frequency modulated signal can then be converted into an optical amplitude modulated signal by passing the frequency modulated signal through an optical filter. The optical filter allows one of the optical frequencies or a range of optical frequencies to pass.

Alternatively, the optical frequency modulated signal can be converted into an electrical frequency modulated signal by heterodyne or homodyne mixing in a photoreceiver. The electrical frequency modulated signal can then be converted to an amplitude modulated signal in subsequent electronics. In such a scheme a second laser light signal (local oscillator signal), which is not modulated or is strictly continuous wave, is combined with the light signal of the FMVCSEL (RF or data signal) at the input of a photodiode. The photodiode then produces an electrical signal (intermediate frequency signal) that is the difference of the frequencies of the two light input signals. The electrical signal can then be processed using standard electronics to demodulate the FM signal and recover the RF or data signal.

Certain output properties of the frequency modulated VCSEL in accordance with the invention are more stable than a VCSEL structure in which current is modulated. Since the VCSEL operates at essentially DC, the modal properties of the frequency modulated VCSEL in accordance with the invention are stable. The frequency modulated VCSEL in accordance with the invention provides a stable optical mode pattern through modulation. In contrast, the prior art VCSELs undergo dynamic optical mode transitions during current modulation.

In an alternative embodiment, the phase adjustment region can be designed to absorb light so that the input signal generates carriers that alter the index of refraction of the phase adjustment region. The FM VCSEL according to this embodiment can be utilized to change an amplitude modulated (AM) signal into a frequency modulated (FM) signal.

Method of Manufacture

A method to manufacture the VCSEL structure having a phase adjustment region is now described. A mirror is formed that includes an active region. A phase adjustment region is also formed for use in altering the characteristics of the VCSEL. A second mirror may also be formed.

In accordance with the invention, the phase adjustment region can include a first surface and a second surface. The phase adjustment region includes an index of refraction that can be modified as described previously.

A first electrode may be formed on the first surface and a second electrode may be formed on the second surface. The first electrode and the second electrode may be utilized for altering the index of refraction of the phase adjustment region, thereby changing the wavelength of the VCSEL.

During operation of the VCSEL, the index of refraction of the phase adjustment region may be altered to change the wavelength of the VCSEL in a variety of different ways. The index of refraction of the phase adjustment region may be altered in an electro-optical manner, a magneto-optical manner, or through the addition of free carriers.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A variable-wavelength frequency-modulated vertical cavity surface emitting laser (VCSEL), comprising:
   a) a first mirror region comprising an active region;
   b) a phase adjustment region having an alterable index of refraction and an optical path length that changes in response to the index of refraction being altered, the phase adjustment region comprising opposing first and second surfaces; and
   c) a first electrode disposed adjacent the first surface and a second electrode disposed adjacent the second surface;
   wherein the first electrode and the second electrode are configured to apply an electric field across the phase adjustment region, and the first electrode, the second electrode, the first mirror region, and the phase adjustment region are configured to to effect a change in a lasing wavelength of the VCSEL as a result of the index of refraction being altered and the optical path length changing in response to the electric filed being applied across the phase adjustment region.

2. The VCSEL of claim 1, the index of refraction is altered through the addition of free carriers to the phase adjustment region.

3. The VCSEL of claim 1, further comprising a second mirror region, wherein the phase adjustment region is disposed between the first mirror region and the second mirror region.

4. The VCSEL of claim 3, wherein the first mirror region and the second mirror region are Distributed Bragg Reflectors (DBRs).

5. The VCSEL of claim 3, wherein a first portion of the active region is disposed in the first mirror region and a second portion of the active region is disposed in the second mirror region.

6. A method of manufacturing a variable-wavelength frequency-modulated vertical cavity surface emitting laser (VCSEL), comprising:
   a) forming a first mirror region comprising an active region;
   b) forming a phase adjustment region having an alterable index of refraction and an optical path length that changes in response to the index of refraction being altered, the phase adjustment region comprising opposing first and second surfaces; and
   c) forming a first electrode disposed adjacent the first surface and a second electrode disposed adjacent the second surface, wherein the first electrode and the second electrode are configured to apply an electric field across the phase adjustment region, and the first electrode, the second electrode, the first mirror region and the phase adjustment region are configured to effect a change in a lasing wavelength of the VCSEL as a result of the index of refraction being altered and the optical path length changing in response to the electric filed being applied across the phase adjustment region.

7. The method of claim 6, further comprising, during operation of the VCSEL, altering the index of refraction of the phase adjustment region to change the lasing wavelength of the VCSEL.

8. The method of claim 6, further comprising providing a second mirror region, wherein the phase adjustment region is disposed between the first mirror region and the second mirror region.

9. The method of claim 8, wherein the first mirror region and the second mirror region are Distributed Bragg Reflectors (DBRs).

10. The method of claim 7, wherein altering the index of refraction of the phase adjustment region to change the lasing wavelength of the VCSEL further comprises altering the index of refraction of the phase adjustment region to change the lasing wavelength of the VCSEL through the addition of free carriers.

11. The method of claim 7, wherein a first portion of the active region is disposed in the first mirror region and a second portion of the active region is disposed in the second mirror region.

* * * * *

UNITED STATES PATENT AND TRADEMARK OFFICE
CERTIFICATE OF CORRECTION

| | |
|---|---|
| PATENT NO. | : 7,295,589 B2 |
| APPLICATION NO. | : 10/368177 |
| DATED | : November 13, 2009 |
| INVENTOR(S) | : Frank H. Peters et al. |

Page 1 of 1

It is certified that error appears in the above-identified patent and that said Letters Patent is hereby corrected as shown below:

Title Page, Column 1, (Inventors), Line 2, delete "Fremeont" and insert -- Fremont --;

Title Page, Column 1, (Assignee), Line 1-2, delete "(Singapore) Pte Ltd," and insert -- IP (Singapore) Pte Ltd., --;

Title Page, Column 2, (Other Publications), Line 4, delete "of" and insert -- on --;

Column 8, Line 2, Claim 1, before "effect" delete "to";

Column 8, Line 5, Claim 1, delete "filed" and insert -- field --;

Column 8, Line 7, Claim 2, after "claim 1," insert -- wherein --;

Column 8, Line 41, Claim 6, delete "filed" and insert -- field --.

Signed and Sealed this

First Day of June, 2010

David J. Kappos
*Director of the United States Patent and Trademark Office*